United States Patent [19]

Ricaud et al.

[11] Patent Number: 5,254,179
[45] Date of Patent: Oct. 19, 1993

[54] PHOTOVOLTAIC DEVICE AND SOLAR MODULE HAVING A PARTIAL TRANSPARENCY

[75] Inventors: Alain Ricaud, Gif-sur-Yvette; Jacques Schmitt, La Ville Du Bois; Jean-Marie Siefert, Arcueil; Thierry Emeraud, Bures-sur-Yvette, all of France

[73] Assignee: Solems S.A., Palaiseau, France

[21] Appl. No.: 836,819

[22] Filed: Feb. 19, 1992

[30] Foreign Application Priority Data

Feb. 21, 1991 [FR] France .................. 91 02075
Apr. 22, 1991 [FR] France .................. 91 04927

[51] Int. Cl.⁵ ........................................ H01L 31/042
[52] U.S. Cl. ............................ 136/244; 136/251; 136/256; 136/258; 437/2; 437/4
[58] Field of Search ....... 136/244, 251, 256, 258 AM; 437/2-5

[56] References Cited

U.S. PATENT DOCUMENTS

| | | | |
|---|---|---|---|
| 4,243,432 | 1/1981 | Jordan et al. | 136/244 |
| 4,542,255 | 9/1985 | Tanner et al. | 136/249 MS |
| 4,663,494 | 5/1987 | Kishi et al. | 136/244 |
| 4,745,078 | 5/1988 | Stetter et al. | 437/4 |
| 4,758,526 | 7/1988 | Thalheimer | 437/2 |
| 4,795,500 | 1/1989 | Kishi et al. | 136/244 |
| 5,176,758 | 1/1993 | Nath et al. | 136/251 |

FOREIGN PATENT DOCUMENTS 3635770 10/1979 Fed. Rep. of Germany ...... 136/256

OTHER PUBLICATIONS

Patent Abstracts of Japan, vol. 9, No. 126 (E-318) May 31, 1985 & JP-A-60 014474 (Matsushita) Jan. 25, 1985.
G. DeSalvo, "An Optimized Top Contact Design for Solar Cell Concentrators," 18th IEEE Photovoltaic Specialists Conference, Oct. 25, 1985, IEEE, pp. 435-436.
"The Electrochemistry of Semiconductors," (Month Unknown) 1962, London, pp. 329-377.

Primary Examiner—Aaron Weisstuch
Attorney, Agent, or Firm—Pollock, VandeSande & Priddy

[57] ABSTRACT

The specification discloses a photovoltaic device comprising a transparent, electrically insulating substrate, a plurality of photoelectric conversion elements using thin-layer technology, disposed as a stack on the substrate, these photoelectric conversion elements comprising a layer of material forming an opaque electrode traversed by cuts or openings, the latter advantageously exhibiting a groove shape which is elongate in a transverse direction of the cell and forming between them bands of material which are favorably oriented in the direction of the photogenerated current lines. A reinforced insulation of the cuts by a protective shoulder between layers may be provided. The invention permits partial-transparency solar cells or modules to be obtained.

13 Claims, 5 Drawing Sheets

PHOTOVOLTAIC DEVICE AND SOLAR MODULE HAVING A PARTIAL TRANSPARENCY

RELATED CO-PENDING APPLICATION

The following co-pending application is related to the present invention: U.S. Ser. No. 07/836,820, filed Feb. 19, 1992.

The invention relates to structures of photovoltaic type having a partial transparency characteristic combining the traditional functions of a solar cell structure generating an electric current with that of a panel which partially transmits light, such structure having applications as photovoltaic cells and modules using thin-layer technology, but also as panels having a partial light transparency for use, for example, as car roofs, boat roofs, or on buildings as elements for windows, doors, verandas, etc.

Of course, this concept of "partial transparency" is already employed in everyday life, for example, when at the location of an opening exposed to the sun there is placed a blind, a slotted shutter or any other perforated wall, the function of which is to partially block out the light, while nevertheless retaining certain parts transparent to this light.

The invention envisages the application of this principle to devices comprising:

a transparent, electrically insulating substrate, a plurality of photoactive elements, using thin-layer technology, disposed as a laminate on the substrate, these photoactive elements comprising an opaque layer of electrically conductive material through which cuts or opening are provided to allow the light which may be received by the cell to pass through said layer, thus permitting the desired partial transparency to be ensured for said cell.

However, tests have shown that especially when such a structure is used as a solar cell and under certain conditions the formation of the transparency cuts in the form of holes or of orifices which are not elongate and peripherally closed ran the risk of causing disturbances in the paths of the current flow lines, the flow lines which meet the holes being detoured by the latter, which form obstacles to the paths by homogeneous sheets of the current flow lines.

A groove-like conformation of the cuts (even with a closed contour) which are elongate in a transverse direction of the cell, perpendicular to the thickness of the layer under consideration and advantageously oriented in the paths of said current flow line, must limit this problem, the cell then at least partially exhibiting a layer structure in the form of bands.

This being the case, the risks of short circuits could continue to be non-negligible under certain conditions, in the event of an edge defect.

For this reason, an object of the invention is to provide a photovoltaic cell using thin-layer technology, in which the risks of short circuits between layers are limited to a great extent.

In order to achieve this, it is proposed "to open" said grooves at their opposite longitudinal ends, this being done on each elementary cell, in such a manner that the band structure of the opaque electrode at least extends continuously from one lateral edge to the opposite edge of the cell under consideration.

By an appropriate orientation of these grooves, and provided that these shall divide the active part of the cell into as many active zones which are not topologically related (in contrast to holes or any other shape of closed contour), the homogeneous-sheet paths of the current flow lines in the layers concerned will thus be all the more favored.

It will further be noted that, again for the purpose of improving the conditions of electrical insulation of the various zones of the cell in relation to one another, a further important feature of the invention consists in advocating a construction of the photovoltaic conversion layer customarily interposed between the "front" and "rear" electrode layers such that it exhibits, at the location of said transparency cuts, a shoulder electrically insulating these electrode layers in relation to one another. With such a shoulder, it will be possible, for the purpose of partial transparency, to make use, almost indiscriminately, of holes of closed contour or of open grooves, or indeed of intermediate configurations.

Besides the device which has just been presented, the subject of the invention is also a process for constructing these interruptions of material through, in particular, the photovoltaic conversion layer.

In fact, the formation of such grooves presents a real problem to the extent that it is well known to a person skilled in the art that a chemical etching through a mask regularly causes a subjacent attack leading to the formation of a protruding mask edging (a phenomenon frequently referred to as "undercutting").

Now, the existence of such a protruding edging necessarily increases the risks of short circuits between the electrode layers, especially if the mask is constituted by the rear electrode which is furthest from the substrate.

In order to solve this problem, the process of the invention proposes:

a) to form the "rear" electrode layer so that it exhibits locally, in contact with the photovoltaic conversion layer, interruptions of material forming the aforementioned grooves, b) then, substantially in the extension of said grooves, selectively to remove the photovoltaic conversion layer so that at these locations this layer itself exhibits grooves which are bounded laterally by a shoulder of material electrically insulating said electrode layers.

Besides the elementary cell and the process of manufacture which have briefly been set forth hereinabove, the subject of the invention is of course also a complete solar module comprising a plurality of such cells electrically connected in series by serial interconnection zones. If one form of groove-type transparency cuts has been adopted, these interconnection zones will intersect, or will border on these grooves, at two neighboring cells.

It will further be noted that, in accordance with a further feature of the invention, both the elementary cells and module will advantageously be such that the human eye can distinguish fairly precisely a form through it, the width of the bands of material separated by said transparency cuts being advantageously of the order of 2 mm.

Of course, all of the above mentioned features also apply when the device of the invention is not used especially for its photoelectric performance (such as in solar cells) but more particularly for its partial light transparency (in buildings for example).

However, the following description will be essentially made, for sake of clarity, with reference to solar cells and modules where photoelectric current is collected.

Figure 1:
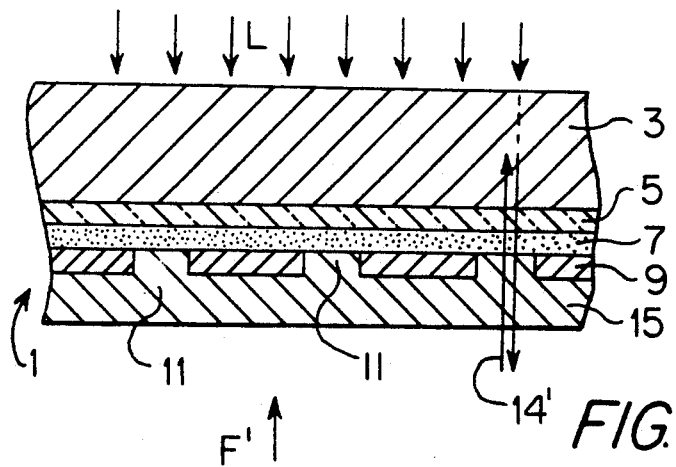
FIG. 1 is a diagrammatic view, in cross-section, of an elementary photovoltaic cell.

Thus FIG. 1 first of all illustrates a detail of a photovoltaic device 1, constructed according to the technique referred to as the "thin-layer" technique.

In a conventional manner, the device in question comprises a series of thin layers 5, 7, 9 forming photoelectric conversion elements which are laminated on a support substrate 3 which is electrically insulating and transparent.

The substrate 3 which is intended to receive first the incident light L of principal illumination of the cell, may be formed, for example, of glass or of polymeric material.

The thin layers on the substrate comprise in succession a layer 5 serving as front electrode (for example constructed of transparent conductive oxide, TCO) having a thickness of a few hundred nm, deposited on the substrate, a semiconductive layer 7 providing the photovoltaic conversion and, over the latter, a layer 9 serving as rear electrode, itself covered with at least one protective film 15 which is transparent and electrically insulating.

The "rear" electrode 9 may, in particular, be constructed of metal or with a laminate of metal layers, and will then be opaque. However, it would also be possible to envisage the inversion of the structure by constructing the latter with a rear electrode of TCO (such as, for example, $SnO_2$, $In_2O_2$, $ZnO$ ...) and an opaque, metal front electrode 5.

In the text which follows, there will only be discussion, however, of the case, judged in this instance to be preferable, of a transparent front electrode 5 and of a rear electrode 9 of opaque material.

With regard to the photovoltaic conversion layer 7, this may, according to a conventional technique, be for example constructed by successive examination of three p-i-n sublayers, each one of these sublayers being constituted from an appropriate semiconductor material such as, for example, hydrogenated amorphous silicon.

In order to impart to such a cell the desired partial transparency, various solutions may be adopted in the configuration of the cuts or openings which have to pass through the opaque electrode in order to provide passages for the light.

First, it is possible to form in this electrode orifices or holes having a closed contour.

Figure 2:
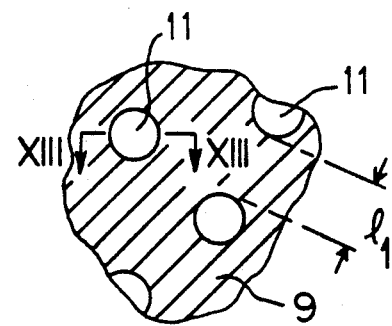
FIG. 2 is a plan view of a part of the cell of FIG. 1, in the direction of the arrow F', FIGS. 3 and 4 each show diagrammatically, according to a local view in plan and in the direction of the arrow F of FIG. 5, an embodiment of a zone belonging to the photoelectrically active surface of a cell of the same type as that of this FIG. 1.

This is the solution illustrated in FIGS. 1 and 2.

In FIG. 1, the orifices 11 accordingly pass through the opaque rear electrode 9.

However, it has emerged that the presence of such holes did not favor the routing of the current flow lines and ran the risk of partially increasing the incidence of short circuits between the electrode layers 5 and 9.

Figure 3:
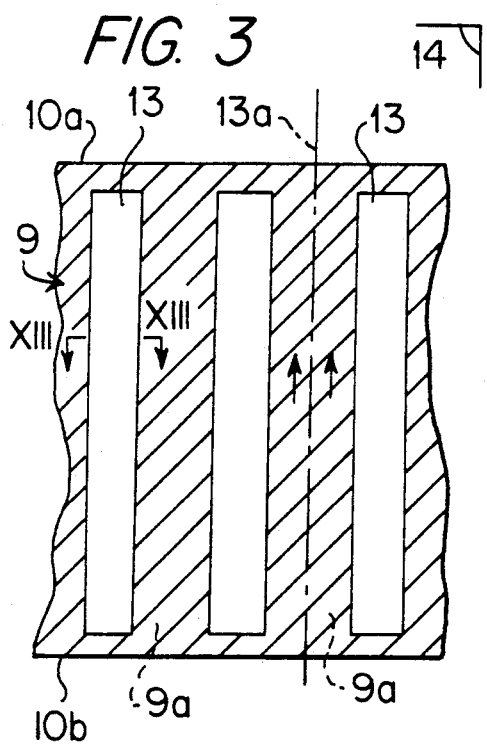

After numerous unsuccessful trials, a first replacement solution, judged to be preferable and illustrated in FIG. 3, was found in the formation of continuous grooves 13, elongated along a transverse direction in the general surface 14 of the cell, this being preferably contained substantially parallel to the direction 13a of the current flow lines proceeding within the electrode 9, these grooves moreover extending advantageously within proximity of the two opposite edges or sides 10a, 10b of said cell.

Figure 4:
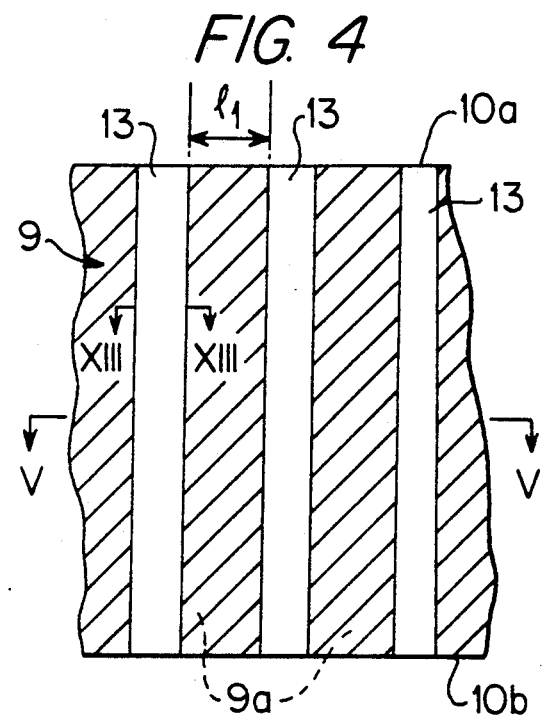

In order to achieve a further limitation of the risks of short circuits, a second solution also appeared, consisting, as illustrated in FIG. 4, in causing the grooves to open out longitudinally.

With this configuration, the opaque electrode 9 will then be in the form of a series of electrically conductive bands 9a extending continuously between the aforementioned opposite sides 10a, 10b of each elementary cell, one band being continuously separated or isolated from the adjacent band by a continuous "transparent" groove 13 formed through the entire thickness of at least the electrode 9 and accordingly opening out in FIG. 4, on both sides 10a, 10b.

Figure 5:
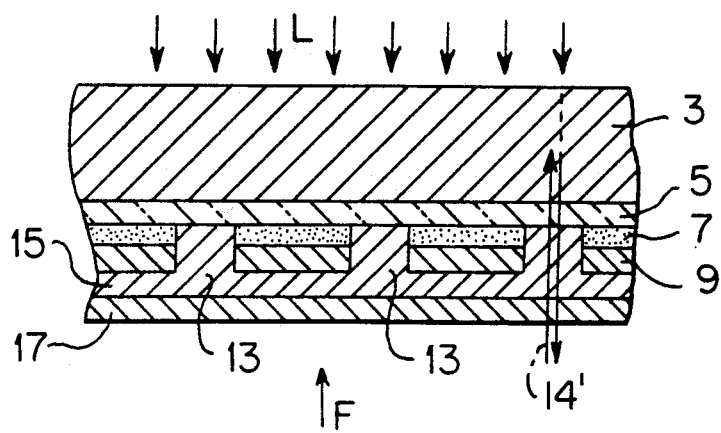
FIG. 5 is a cross-sectional view along the section line V-V of FIG. 4.

In FIG. 5, it will be noted that the grooves 13 are formed not only through the rear electrode 9 but also through the semiconductor layer 7 and are filled by the protective insulating layer 15, which is preferably neutral from the point of view of coloration, and which is itself covered with a complementary protective transparent and insulating sheet or plate 17 which is more rigid, for example of glass or of polymethyl methacrylate.

It may even be possible to contemplate a comparable removal of material (by bands) from the transparent front electrode 5.

Of course, such a cutting out of the layers 7 could also have been provided within the context of FIGS. 1 and 2, by an extension of the holes through the overlying layer or layers.

In a general way, the object of the "partial transparency" not being so much to transmit the incident light through each cell as to enable a person to see or to distinguish a form through it, especially in the inverse sense (arrow 14' of FIGS. 1 and 5), it may reasonably be considered that, in order that an image should be capable of being seen by a human eye in terms of the essence of these details, without excessively reducing the electrical output of the cell, the width $l_1$ of the spaces or edges between cuts (such as 9a in FIG. 4) should not exceed approximately 2 to 2.5 mm, at least on the active central part of the cell, with a preferably substantially regular distribution of the cuts.

Let us now refer to FIGS. 6 to 11 to see an illustration of a photovoltaic module constituted by a series of elementary solar cells, which may be of one of the types of those of the preceding figures, these cells being associated in series, one following the other.

Figure 6:
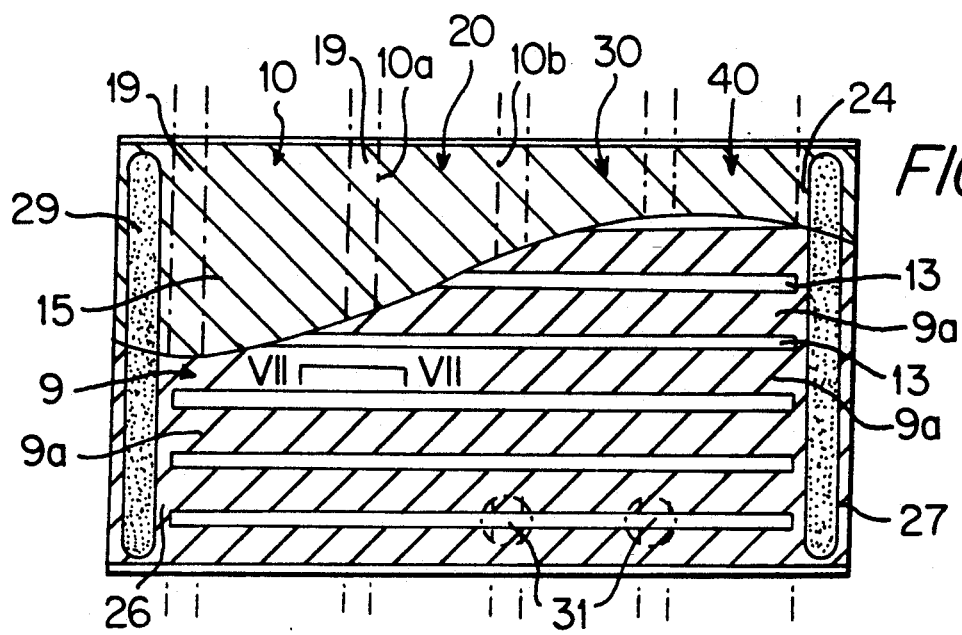
FIG. 6 is a diagrammatic view, in plan, of a solar module, comprising elementary cells connected in series.
Figure 7:
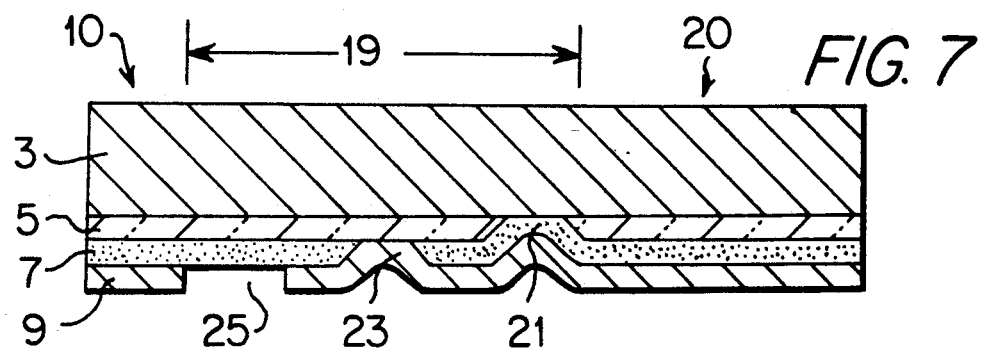
FIG. 7 is a local view in transverse cross-section along the line VII-VII of FIG. 6, FIGS. 8 and 9 are two partial diagrammatic views, in plan, of modified embodiments of the module illustrated in FIG. 6.

FIG. 6 shows a partial illustration of such a module comprising four elementary solar cells 10, 20, 30, 40 connected in twos on their lateral sides, such as 10a, 10b for the cell 20, by serial interconnection bands which are diagrammatically represented by the zones 19.

Various techniques may be utilized for these connections. U.S. Pat. No. 4,243,432 describes one possibility, the principle of which has been illustrated in FIG. 7, where it is possible to see an interconnection zone or band 19 constituted by three parallel and substantially adjacent zones: a zone 21 of interruption of the front electrode 5 where the photovoltaic conversion layer 7 of a cell comes directly into contact with the substrate 3, a zone of piercing or of interruption 23 of this same semiconductor layer where the rear electrode 9 comes directly into contact with the front electrode 5 of an adjacent cell, and then another zone 25 of interruption of the rear electrode 9.

Figure 9:
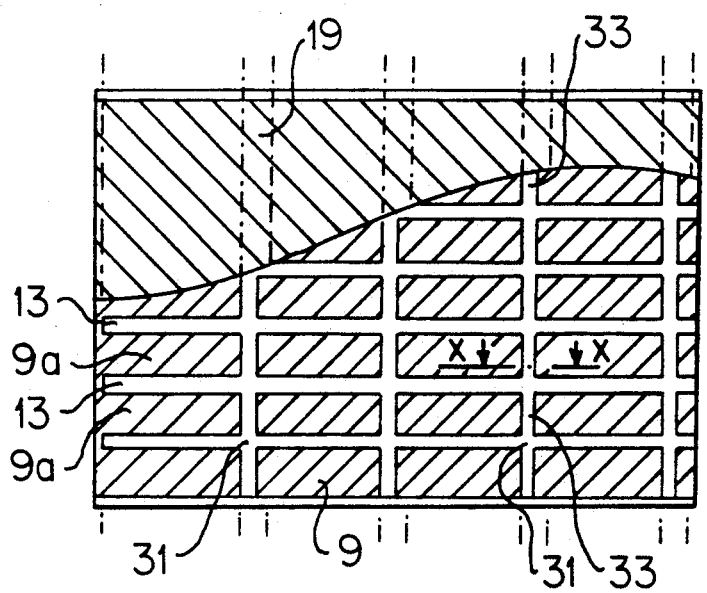

It will be noted that an easy way of forming such a module by integrating the semi-transparency "in bands" may consist in orienting the bands 9a of each elementary cell substantially perpendicular to the direction of the serial interconnection bands 19, by cutting out (for example by etching with removal of material) the grooves 13 through the layer or layers under consideration, this taking place over the bulk of the length of the module (as illustrated in FIGS. 6 and 9). It will then be sufficient to reconnect in the conventional manner all the bands to one another on the opposite lateral sides 24, 26 of the module, and to provide the contact resumption zones 27, 29, as illustrated in FIG. 6, with connection of the electrical connecting cables (not shown).

This technique does not present any real difficulty, except possibly where the formation of the grooves 13 open at their ends interferes with the formation of the bands 19, at the location of their intersections, as referenced 31 in FIGS. 6 and 9.

Figure 8:
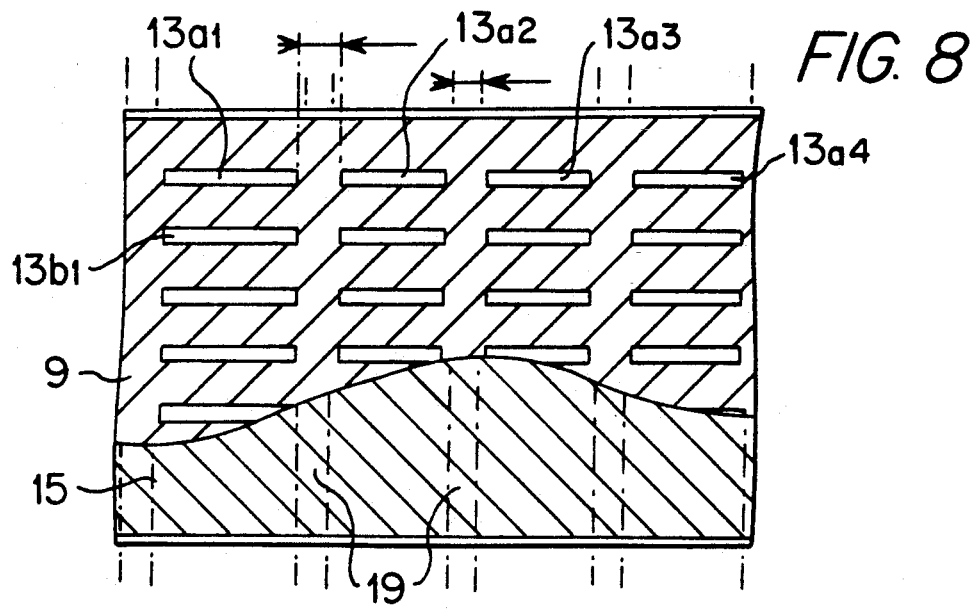

In particular in this case, it is possible to make use of the geometry of FIG. 8, where the module illustrated is constituted by a series of elementary cells of the same type as that of FIG. 4 with grooves 13 which do not open out and which are present, per line, in the form of sections 13a1, 13a2, ..., 13a4, 13b1 ..., the interruptions being situated at the locations of the interconnection bands 19, the width 1' between two consecutive sections of grooves of one and the same line possibly being approximately 0.5 to 2 mm (a priori greater than or equal to the width of the bands 19).

Figure 11:
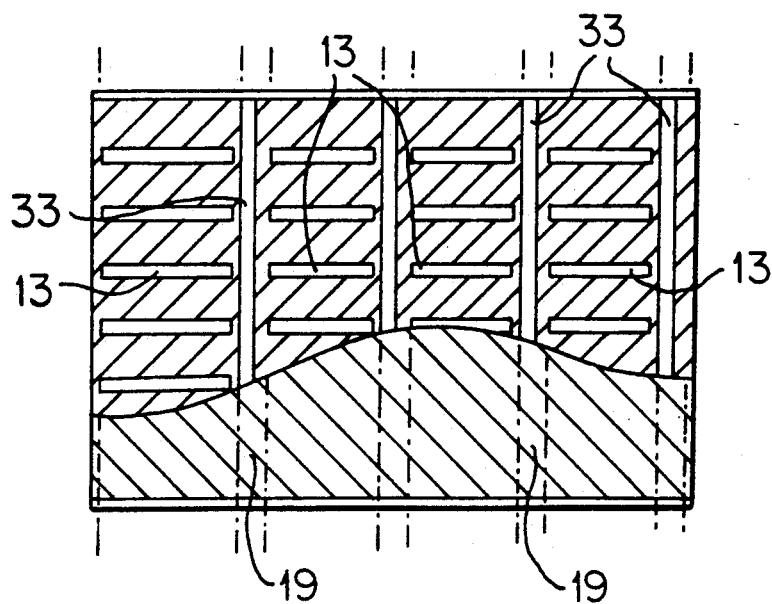
FIG. 11 is a partial diagrammatic view in plan of another modified embodiment of a solar module.

Of course, these features are likewise applicable to the modified embodiment of FIG. 11, which shows a construction of grooves by sections and in lines.

The particular feature of the geometry illustrated in this FIG. 11, as well as in FIG. 9, is due to the fact that there has in this instance been a desire to achieve a further increase in the level of semi-transparency by creating along the serial interconnection bands complementary transparent grooves referenced 33 which may extend perpendicular to the "elementary" grooves 13.

Figure 10:
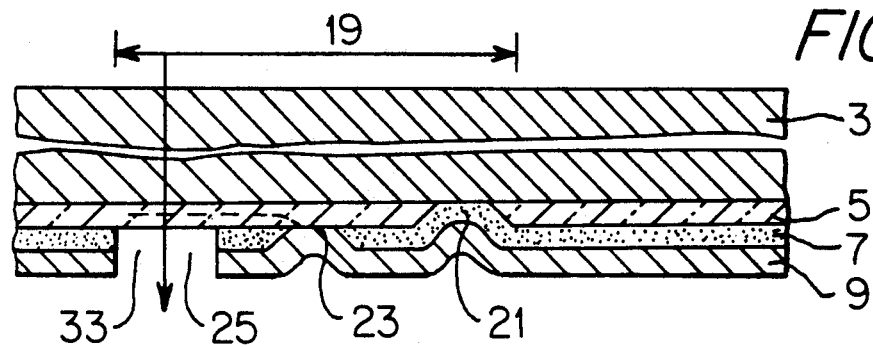
FIG. 10 is a diagrammatic local view, in transverse cross-section along the line X—X of FIG. 9.

The construction of these complementary grooves 33 is illustrated in cross-section in FIG. 10, where it appears that in the set of three stripes 21, 23, 25 the cut 25 of the rear electrode 9 may become transparent, subject to the condition that the cut 33 is made through the semiconductor layer 7, this taking place as a continuation of the cut 25, at the location of the serial interconnection bands 19.

We shall now be concerned with FIGS. 12 to 17D in order to provide a more detailed description of another improvement proposed by the invention, still within the context of the limitation of the problems of short circuits, whether these arise at the location of the transparency cuts 11, 13 or in proximity to the perimeter edging 35 of a complete module, as illustrated in FIG. 11.

Accordingly, whether on a photovoltaic device which is conventional or with partial transparency, the solution proposed in the present case consists in providing, at the location of any cut made through the photovoltaic conversion layer 7, a head of material protruding towards the interior of the cut under consideration and thus forming an electrically insulating shoulder between the electrode layers 5 and 9.

Figure 13:
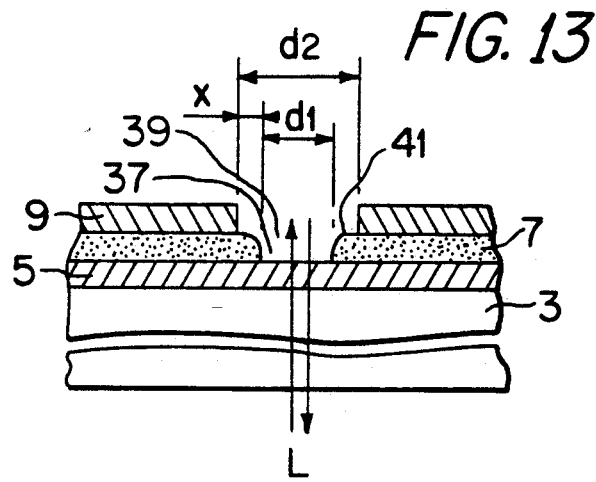
FIG. 13 is a local view in transverse cross-section along the line XIII—XIII of FIGS. 2, 3 or 4.

It is moreover for this reason that the cut 37 of FIG. 13 formed in the photovoltaic layer 7 exhibits a transverse dimension (or a cross-section) $d_1$ smaller than the transverse dimension $d_2$ of the adjacent cut 39 previously formed through the upper electrode layer 9.

In order to increase the reliability of the results, it will be advised to construct the shoulder 41 thus formed in such a manner that it extends continuously along the entire edging of each cut under consideration.

Based on the trials which have been conducted, it has been observed that favorable results were obtained when the shoulders 41 exhibited a width x within the range between approximately 5 and 50 $\mu$m (microns).

Figure 14:
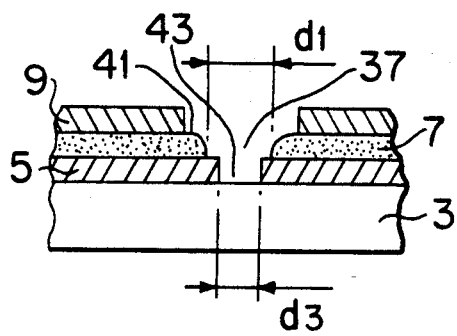
FIG. 14 shows, in transverse diagrammatic cross-section, the insulating groove of FIG. 12 at the location of the detail referenced XIV on this same FIG. 12, FIGS. 15A, 15B, 15C, 15D, and 15E also show diagrammatically, according to a transverse cross-section, the principal steps of a process of manufacture which may be followed for the purpose of forming the insulating perimeter groove of FIGS. 12 and 14.

It will however be noted that, if the cut is to be made in order to form the continuous perimeter groove 35 ensuring the electrical insulation of the active part of a module in relation to its external edging, the stripe or cut 43 which will have been formed through the first electrode layer 5 will preferably exhibit a transverse dimension $d_3$ (or cross-section) smaller than that $d_1$ of the cut 37 made through the layer which surmounts it (see FIG. 14). Thus, what is obtained will be a triple layer groove having edges in the form of steps.

In order to form such interruptions of material, the overall procedure adopted will be conventional, providing first of all the cuts through the entire thickness of the rear electrode layer 9, and then selectively removing, substantially as an extension of said cuts, the photovoltaic conversion layer 7, for example by chemical etching.

Figure 12:
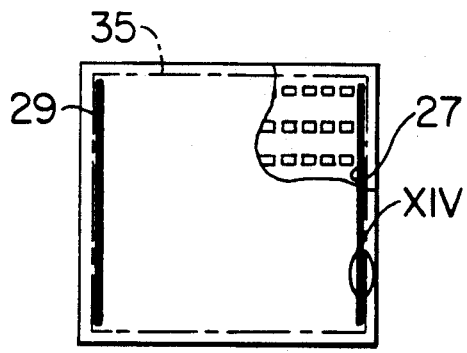
FIG. 12 illustrates, according to a plan diagrammatic view, a solar module on a reduced scale exhibiting over its entire periphery an insulating groove according to the invention.

For further details, we shall first of all be concerned with the manner of forming the perimeter insulation cut 35 of FIG. 12.

Figure 15A:
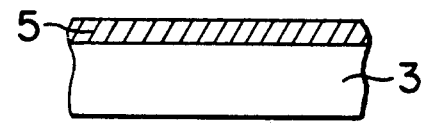

For this, we shall refer first of all to FIG. 15A, in which it is seen that (for example by cathode atomization under partial vacuum) the first electrode layer 5 is deposited on a face of the substrate 3.

Figure 15B:
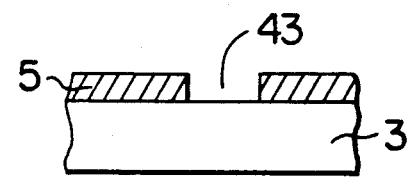

It will then be possible to undertake the formation, through the electrode 5, of the "basic" perimeter groove 43, the start of said insulating cut (FIG. 15B).

In order to do this, it will be possible to make a laser ablation with a beam wavelength of the order of 1.06 μm for an $SnO_2$ layer having a thickness of approximately 600 nm, it being possible for the groove 43 to have, on the periphery of the module under consideration, a width $d_3$ of a few tens to a few hundreds of microns.

Figure 15D:
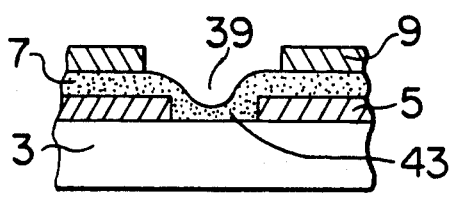
Figure 15C:
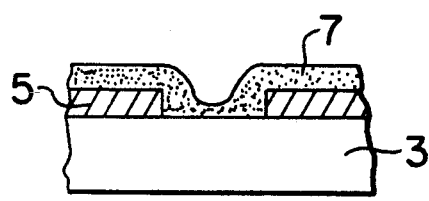

After this, it will be possible to deposit on this peripheral-groove layer the photovoltaic conversion layer 7, such as a layer of amorphous silicon of 200 to 400 nm (FIG. 15C).

After this, the depositing of the metal layer forming the electrode 9 may be carried out on top of the layer 7.

In order to obtain the desired cuts through the electrode 9, and this, of course, taking place in the vertical extension of the groove 43, it is advisable first of all to perform the continuous depositing of the layer (or the sublayers) of material, and then selectively to etch the electrode facing said groove 43, for example by cathode atomization or vaporization through a suitable metal mask.

However, it would likewise be possible to make use of a so-called development technique (or technique of "patterning by lift-off") mentioned, in particular, in U.S. Pat. No. 4,443,651 or Japanese patent JP-A-61 098 686.

In any event, the groove formed through the layer 9 will preferably have a width greater than that of the groove 43 of the layer 5 (FIG. 15D).

Figure 15E:
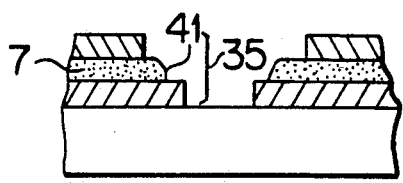

Having arrived at this step, it will remain to remove selectively the conversion layer 7 between the two grooves 39 and 43, providing the insulating shoulders 41 (see FIGS. 14 and 15E).

Figure 16:
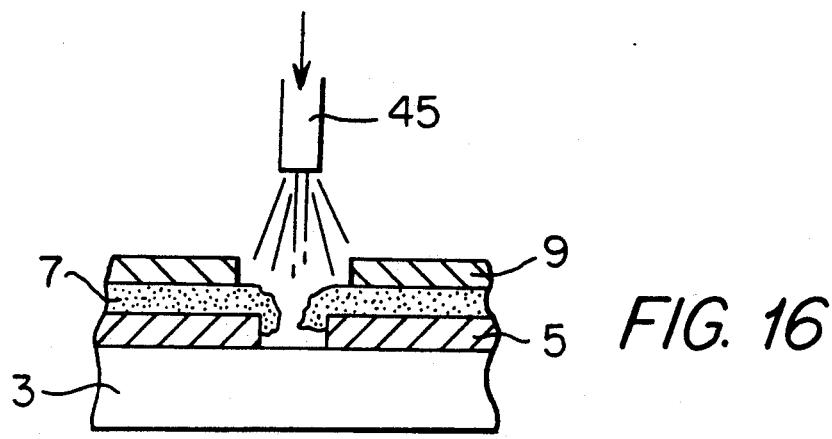
FIG. 16 shows, in transverse cross-section, a photovoltaic conversion layer in the course of being chemically etched, and FIGS. 17A, 17B, 17C, and 17D diagrammatically illustrate, in transverse local cross-section, the principal steps which may be followed for the purpose of forming the structure of FIG. 13.

To do this, use will advantageously be made of chemical etching. More specifically, and especially in the case of a layer 7 based on amorphous silicon and in the presence of a rear electrode 9 based on a non-oxidizing metal resistant to NaOH, recourse will advantageously be had to the utilization of NaOH solution which it will in particular be possible to atomize or to spray in the liquid phase onto the semiconductor layer, at the locations of the cuts, this taking place from, for example, atomization nozzles such as 45 (FIG. 16).

It will in particular be possible to utilize a NaOH solution concentrated between approximately 5 and 40%, brought to a temperature of 45° to 65° C., and to provide a period of application of a few minutes.

It should be noted that this operation does not necessitate any special masking of the rear face of the module, which would be very problematic to carry out, having regard to the customary dimensions of etching to be performed.

This gives the structure of FIG. 15E (identical to that of FIG. 14).

Apart from the initial formation of the peripheral cut 43 through the first electrode layer 5, the technique which has just been set forth is entirely applicable to the construction of a partial-transparency photovoltaic device; this applies to each elementary cell.

For the sake of enhanced clarity, FIGS. 17A to 17D also show the principal steps in the construction of such a structure.

Figure 17A:
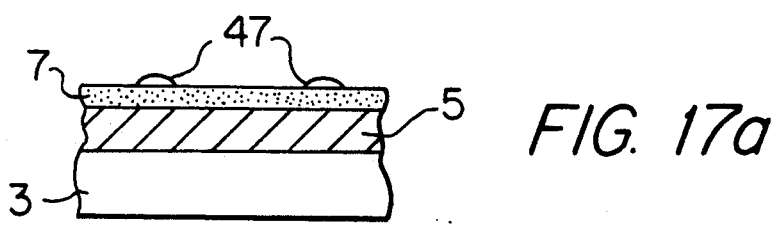
Figure 17B:
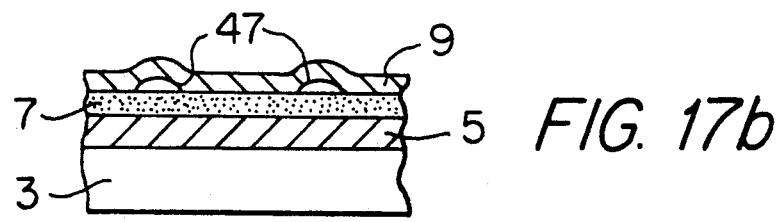
Figure 17C:
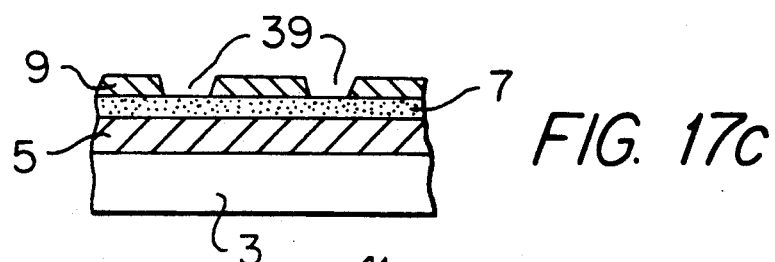
Figure 17D:
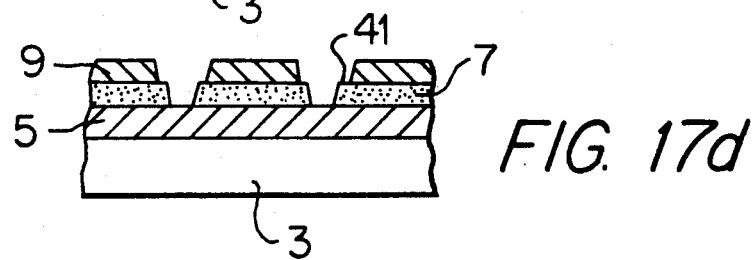

In these figures, it will in particular be noted, with regard to FIGS. 17A and 17B, that these figures illustrate the case (inter alia) where the local ablation of the metal layer 9 is carried out by "lift-off" (development), that is to say, by depositing, at the locations where it is desired to form the passages 11 or 13 which are useful for the semi-transparency, a paste 47 which is adhesive but peelable, this taking place on the previously deposited photovoltaic conversion layer 7, these patterns of development paste then being covered, just like the entire layer 7, by the rear electrode layer 9 (see FIG. 17B), the aforementioned technique of "lift-off" then permitting, by development, the removal of this paste and of the metal attached to it, where the paste has been deposited, thus ensuring the obtaining of the cut patterns 39 illustrated in FIG. 17C. Remaining is the NaOH chemical etching of the adjacent photovoltaic conversion layer 7 in order to obtain the desired semi-transparency patterns with their electrical insulating edging 41 (see FIG. 17D).

Even though the nature of the semiconductor layer 7 is relatively important, it must be clear that it would be possible to construct this layer with an n-i-p structure, or even with a p/n or other junction, this being made with other semiconductors, such as $CuInSe_2$, CdS, CdTe or GaAs, the nature of the solution utilized for the etching thereof then being adapted as a consequence.

It might likewise be beneficial to form, in accordance with the invention, a structure of the "tandem" type, that is to say a nowadays conventional structure comprising a double stack of thin layers, which may or may not be separated by a transparent, electrically insulating linking layer.

Since, over and above the realization of solar cells and modules, the invention also applies to partially light transparent panels for buildings, car roofs, verandas, etc., we point out that the structure of such a panel corresponds to the illustration of FIG. 6 or 8. If transmission of generated photoelectric current is of no use, the electrical terminals 27, 29 can be eliminated and the interconnection bands not provided.

For coating the substrate 3 with the successive photoresponsive thin layers (opaque metallic and transparent electrically layers 5, 9 and semiconductor layer 7) the same processes can be used, such as CVD plasma process, magnetron cathodic atomization. And the cuttings or grooves 11, 13 can be made also by cathodic atomization or through a patterning by lift off. U.S. Pat. No. 4,443,651 describes a technique of coating and U.S. Pat. No. 4,795,500 describes techniques of coating and of scribing holes in photovoltaic devices.

We claim:

1. A photovoltaic device for producing photogenerated current, comprising:

a transparent electrically insulating substrate;

a plurality of photosensitive elements laminated on the substrate;

said photosensitive elements comprising an opaque electrically conductive layer through which continuous parallel grooves are formed to allow light to pass through the device, the photogenerated current flowing in said conductive layer along a predetermined direction;

said grooves extending longitudinally along the direction of the photogenerated current, from a first end of said conductive layer to a second opposite end thereof, thereby dividing said conductive layer into a series of continuous bands.

2. A device according to claim 1, wherein said photosensitive elements are laminated layers comprising:
a transparent electrically conductive layer; and
a photovoltaic conversion semiconductor layer interposed between said transparent conductive layer and said opaque conductive layer.

3. A device according to claim 2, wherein said grooves extend through the semiconductor layer.

4. A device according to claim 3, wherein a section of said grooves extending through the opaque conductive layer is larger than through the semiconductor layer, for providing an insulation shoulder between said two layers, said shoulder having a width between 5 and 50 microns.

5. A device according to claim 3, wherein said photovoltaic conversion layer comprises amorphous silicon and said opaque conductive layer comprises a non-oxidizing metal resistant to NaOH.

6. A photovoltaic device comprising:
a transparent electrically insulating substrate;
a plurality of photosensitive elements laminated on the substrate;
said photosensitive elements comprising an opaque electrically conductive layer through which continuous parallel grooves are formed to allow light to pass through the device;
said grooves extending longitudinally substantially parallel to each other, the distance between two successive grooves being less than or equal to substantially 2.5 mm, for allowing a human eye to substantially distinctly see through the device.

7. A solar module comprising:
a plurality of elementary photovoltaic cells electrically connected in series;
said cells being formed on an electrically insulating, transparent substrate, each cell comprising a plurality of photosensitive elements laminated on said substrate;
said photosensitive elements including an opaque electrically conductive layer through which continuous parallel grooves are formed to allow light to be received by the module for passage therethrough, said grooves extending longitudinally, substantially parallel to each other, the distance between two successive grooves being less than or equal to substantially 2.5 mm.

8. A module according to claim 7 wherein each of said photovoltaic cells is rectangular and has two opposite edges, said grooves extending without discontinuity from the vicinity of one of said edges up to the opposite edge.

9. A module according to claim 7 wherein each of said cells is rectangular and has two opposite edges, said grooves extending without discontinuity from one of said edges up to the opposite edge.

10. A module according to claim 7 further comprising elongated serial connection zones for connecting two elementary cells in series, said connection zones extending transversely to said elongated grooves.

11. A module according to claim 10, wherein said photosensitive elements of each cell are laminated and comprise:
a transparent electrically conductive layer;
a photovoltaic conversion semiconductor layer interposed between said transparent conductive layer and said opaque conductive layer;
and wherein said module further includes complementary transparent grooves extending transversely to said grooves of the cells, along at least some of said serial interconnection zones, said complementary grooves being formed through said photovoltaic conversion semiconductor layer, within the continuity of other grooves formed through said opaque conductive layer.

12. A solar module for producing photogenerated current comprising:
a plurality of elementary photovoltaic cells electrically connected in series;
said cells being formed on an electrically insulating, transparent substrate, each cell comprising a plurality of photoelectric conversion elements laminated on said substrate;
said photosensitive elements including a layer of opaque electrically conductive material through which longitudinal grooves are formed to allow light to be received by the module and pass therethrough, the photogenerated current flowing in said conductive layer along a predetermined direction, said grooves extending longitudinally without discontinuity, parallel to each other and to said direction of the photogenerated current, from a first end of said layer up to a second opposite end, thereby dividing said opaque conductive layer into a series of continuous bands.

13. A laminated photovoltaic device comprising:
an electrically insulating substrate;
an opaque metallic layer disposed on said substrate and through which elongated parallel grooves are formed to allow light to be received by the device to pass therethrough;
a photovoltaic conversion semiconductor layer disposed on said metallic layer; and
an optically transparent conductive layer disposed on said semiconductor layer.

* * * * *